United States Patent
Watanabe et al.

[11] Patent Number: 5,917,103
[45] Date of Patent: Jun. 29, 1999

[54] METHOD OF MANUFACTURING CRUCIBLE FOR DOUBLE-CRUCIBLE CRYSTAL GROWING TECHNIQUE

[75] Inventors: Hiroyuki Watanabe; Tatsuhiro Sato, both of Takefu; Hiroshi Matsui, Koriyama, all of Japan

[73] Assignees: Heraeus Quarzglas GmbH, Hanau, Germany; Shin-Etsu Quartz Products Co., Ltd., Tokyo, Japan

[21] Appl. No.: 08/653,131

[22] Filed: May 24, 1996

[30] Foreign Application Priority Data

May 31, 1995 [JP] Japan .................................. 7-155616

[51] Int. Cl.⁶ .......................... C03B 19/04; C03B 19/09; C03B 23/20
[52] U.S. Cl. .............................. 65/17.3; 65/17.6; 65/36; 65/71; 65/DIG. 8; 117/213; 117/31
[58] Field of Search ..................... 65/17.3, 17.6, 65/36, 57, 71, 17.1, 144, 374.13, 405, DIG. 8, 375, 502; 117/213, 31, 932; 373/163

[56] References Cited

FOREIGN PATENT DOCUMENTS

| 283903 | 9/1988 | European Pat. Off. . |
| 610065 | 8/1994 | European Pat. Off. . |
| 56-149333 | 11/1981 | Japan . |
| 63-233092 | 9/1988 | Japan . |
| 422861 | 4/1992 | Japan . |

*Primary Examiner*—Steven P. Griffin
*Attorney, Agent, or Firm*—Whitman Breed Abbott & Morgan LLP

[57] ABSTRACT

Quartz powder is fed into a rotating mold to form a crucible-like quartz powder layer body with the help of centrifugal force in the mold. The layer is melted by heating through the inner surface with an arc discharge to manufacture an outer crucible member. A hollow cylindrical inner crucible member having a beveled lower edge is welded to the outer crucible member while a temperature of the inner surface portion of the outer crucible member remains at 1400° C. or higher by a remaining heat.

6 Claims, 3 Drawing Sheets

METHOD OF MANUFACTURING CRUCIBLE FOR DOUBLE-CRUCIBLE CRYSTAL GROWING TECHNIQUE

FIELD OF THE INVENTION

The present invention generally relates to a method of manufacturing a crucible for a double-crucible growing technique and, more particularly, relates to a method of manufacturing a crucible for a double-crucible growing technique with which silicon single crystal rods are continuously pulled.

PRIOR ART

The so-called Czochralski method has been used for growing a silicon single crystal rod wherein a single crystal seed is dipped in a melt contained in a crucible and the seed is then pulled up gradually while being rotated to grow single crystal at the lower end of the seed. There is a need to feed raw material to the melt during a pulling process because of a size limitation in manufacture of a crucible, so that a single crystal having a longer length and larger diameter can be grown, such a larger single crystal being indispensable for economic production of a silicon chip for a semiconductor device. For this purpose, a crucible for a double-crucible growing technique (hereinafter referred to as a dual crucible) was developed, which includes an inner crucible to grow a single crystal therein and an outer crucible to feed a raw material, a capillary opening being formed in the inner crucible to feed a melt from the outer crucible into the inner crucible.

A dual crucible has been manufactured using an oxygen-hydrogen burner or the like, in which an inner crucible is fixed by welding to an outer crucible, each having been already completed as a crucible. This method is time consuming and therefore results in low productivity and a costly dual crucible. Unexamined Patent Application No. SHO 63-233092 discloses a second method, in which outer and inner crucibles are welded to each other by softening both in a susceptor, in order to pare down the cost of a crucible. The second method, however, has many technical problems. First, welding between crucibles by softening at a high temperature can cause deformation of the crucible. Secondly, it uses an inner crucible having a bottom, and, therefore, needs a complex mechanical processing such as drilling a proper hole in the bottom of the inner crucible at a position just opposite to the center of the bottom of an outer crucible, such complexity increasing cost. Thirdly, there is a risk of leaking the melt through pinholes remaining in the welded portion when the accuracy in machining is poor.

SUMMARY OF THE INVENTION

According to the invention, a crucible for a double-crucible growing technique is manufactured by feeding quartz powder into a rotating mold; forming a crucible-like quartz powder body with the help of a centrifugal force in the mold; melting the body by heating the inner surface with an arc discharge to manufacture an outer crucible member; and then welding an inner crucible member to the outer crucible member while a temperature of the inner surface portion of the outer crucible member remains at 1400° C. or higher by remaining heat from a previous operation.

According to the invention, a welded portion between crucibles is improved and the cost of a dual crucible is decreased, by welding an inner crucible member in the shape of a hollow cylinder to an outer crucible member while the temperature of the outer crucible still remains high by remaining heat from a previous operation.

It is an object of the present invention to provide a method of manufacturing a quartz dual-crucible excellent in characteristics of welded portion between crucibles.

It is another object of the present invention to provide a method of manufacturing a quartz dual crucible at a low manufacturing cost and with a higher productivity.

DETAILED DESCRIPTION OF THE PREFERRED EMBODIMENTS

Figure 1:
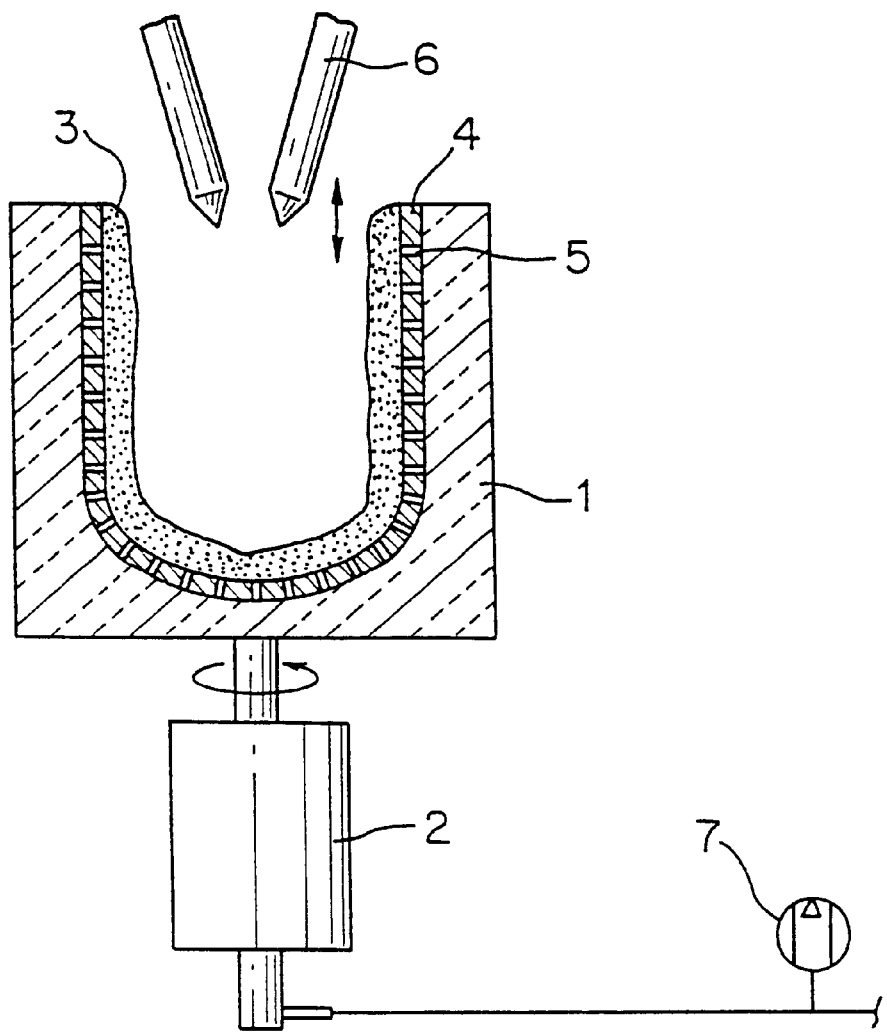
FIG. 1 is a schematic side elevation view, partly in vertical section, illustrating the main part of an apparatus for manufacturing an outer quartz crucible member according to the present invention.

Three methods are named as methods of manufacturing an outer crucible member. A first method includes the steps of: feeding quartz powder in a rotating mold; forming a quartz powder layer body in the shape of a crucible; and melting the body by heating the inner surface with an arc discharge. A second method includes the same steps as those in the first method, except that the mold has gas-permeable side and bottom portions and the quartz powder layer body is melted by heating while the gas in the quartz layer is drawn by means of a vacuum device, which is disclosed in a publication of Unexamined Japanese Patent Application No. SHO 56-149333. A third method includes the steps of feeding crystalline quartz powder or amorphous quartz powder in a quartz glass substrate while rotating, the substrate being manufactured by means of the first method or the second method; and melting the powder by heating to form a transparent layer on the inner surface of the substrate, which is disclosed in a publication of Unexamined Japanese Patent Application No. HEl 4-22861.

The inner crucible member has the shape of a hollow cylinder with at least one and preferably 2 to 4 capillary openings for passing melt in the lower part, and is mechanically finished so as to have an outside diameter of 70% to 90% of the inside diameter of the outer crucible member. Melt of raw material fed to the outer crucible is introduced into the inner crucible through the above mentioned openings and thus continuous silicon single crystal growth can be realized. When 2 to 4 openings for melt pass are provided, oscillation in height and fluctuation in temperature of the melt surface in the inner crucible can be favorably suppressed. The precision of welding can be improved and thereby no bubble is produced in a junction when the lower end surface is inwardly inclined at about 30 degrees to 60 degrees from the side walls and the sharpened edge of the lower end is finished by grinding with a gap or error of 1 mm or less from a plane perpendicular to the inner crucible axis.

An inner crucible member is finished by mechanically processing the hollow cylindrical quartz body described above. The machined inner crucible member is further heated and cooled in order to remove strains and the surface is still further smoothed by fire polishing.

A method of manufacturing according to the present invention has a step of welding an inner crucible member with an outer crucible member, while a temperature of the inner surface portion of the outer crucible member still remains at a temperature of 1400° C. or higher by a remaining heat in the mass after manufacture of the outer crucible member in order to manufacture a quartz dual crucible, wherein a temperature of the outer crucible member at welding is especially preferred to be 1800° C. or higher. When the welding is conducted at a temperature of 1800° C. or higher, the crucibles well welded to each other and the production yield of good dual crucibles is increased. At a temperature of welding being lower than 1400° C., a poor junction between the members is apt to occur and, as a result, leakage of a melt often results.

Referring to FIG. 1, an outer crucible member is obtained according to the above mentioned second method by feeding quartz powder into a mold 4 which is hollow inside and open upward and which has a plurality of gas-permeable through-holes 5 on the side, while rotating on a rotation driving device 2 to preform a crucible-like crystalline quartz powder layer body 3 having an upward opening. Heat for melting the layer body 3 is applied through the inner surface with an arc discharge electrodes 6 shifted down and at the same time under vacuum-suction by way of the through-holes 5 which are in turn communicated with each other in a cavity (not shown) inside a support 1, which cavity communicates with a vacuum pump 7 via a vacuum line through the central axis of device 2.

Figure 2:
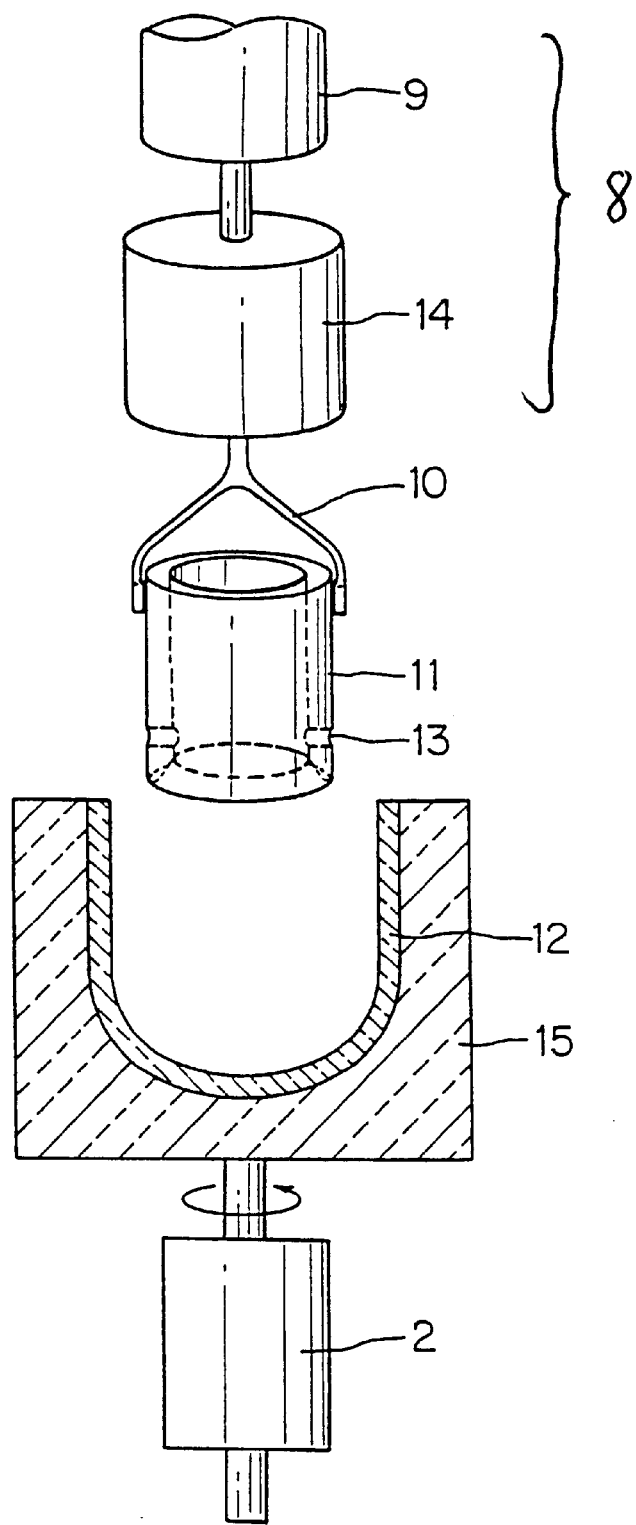
FIG. 2 is a schematic side elevation view, partly in vertical section, illustrating the main parts of an apparatus of welding an inner quartz crucible member to an outer crucible member according to the present invention.

Referring to FIG. 2, the thus obtained opaque outer crucible member 12 is placed in a graphite mold 15 and transported to a place where a welding apparatus 8 of an inner crucible member is installed. The inner crucible member 11 is contacted to a part inside the outer crucible member 12, which has stopped rotating and the temperature of which remains at a temperature of at least 1400° C., preferably 1800° C. or higher by a remaining heat, by lowering the inner crucible member 11 suspended from a crucible holder 10 of a holder elevator 9 while keeping a concentric relation with the outer crucible member 12. The inner crucible member 11 is pressed by way of the crucible holder 10 to the outer crucible member 12 fixedly supported in a graphite mold 15 with an upward opening to complete welding. The outside diameter of the inner crucible member 11 is in the range of 70% to 90% of the inside diameter of the outer crucible member 12. When an outside diameter of the inner crucible member 11 is smaller than 70% of an inside diameter of the outer crucible member 12, the cost per chip goes up. On the other hand when an outside diameter of the inner crucible member 11 is larger than 90% of an inside diameter of the outer crucible member 12, melt supply to the inner crucible 11 is not sufficient, and not only the height but also the temperature of the surface of the melt in the inner crucible 11 fluctuates. As a result a good quality single crystal cannot be grown.

Figure 3:
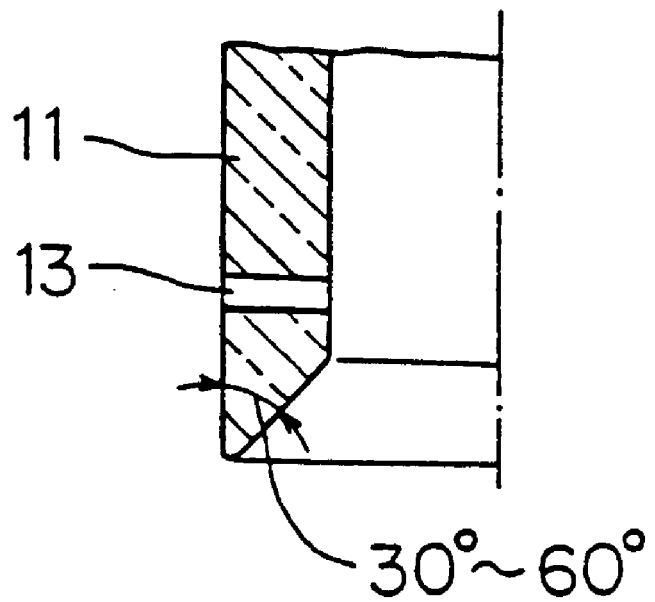
FIG. 3 is an enlarged fragmentary sectional view of the lower end portion of an inner quartz crucible member.

As shown in FIG. 3, an opening 13 for melt pass is formed in the lower part of the inner crucible member 11. The lower end surface of the inner crucible member 11 has an angle between about 30 degrees to 60 degrees inclined inwardly from the side walls and the sharpened edge of the lower end is aligned with a plane perpendicular to the axis with a gap or error of 1 mm or smaller, so that no bubble can be generated in the junction.

In the above mentioned manufacturing method, cracking does not occur and the chances of damage are small when the inner crucible member is preheated to a temperature roughly equal to a temperature of the outer crucible member with a crucible heater 14 mounted in the holder elevator 9.

An arc discharge is capable of heating an object to a temperature on the order of 3000° C. A temperature of a molten crucible surface heated by the arc discharge is raised to a temperature close to 2000° C. Consequently, the remaining heat can easily keep a temperature of the inner surface of an outer crucible at 1400° C. or higher, or with skill, 1800° C. or higher and thus energy saving is also achieved.

Examples of the present invention will be described in detail. It is to be expressly understood that the details described in the examples are shown only for the purpose of illustration and do not limit the scope of the present invention.

EXAMPLE 1

An inner crucible member was mechanically finished from a hollow quartz cylinder to an outside diameter 80% of the inner diameter of an outer crucible member, the height being 70% of the depth of the outer crucible member. At the same time two openings for melt pass were also formed mechanically in the lower part. The inner crucible member was welded to an outer crucible member manufactured by the method shown in FIG. 1, while the temperature of the outer crucible remained at 1800° C. by remaining heat. The observation is shown in Table 1.

EXAMPLE 2

The lower end of an inner crucible member was heated to 1800° C. with a crucible heater and then joined to an outer crucible member. The other steps of manufacturing a quartz dual crucible were the same as those of Example 1. The observation is shown in Table 1.

EXAMPLE 3

A quartz dual crucible was manufactured in the same way as in Example 2 except that the lower end of an inner crucible member was sharpened by mechanically processing so that the angle between the lower surface of the lower end and the side walls was 45 degrees inclined inward from the side walls. The observation is shown in Table 1.

COMPARATIVE EXAMPLE 1

A quartz dual crucible was manufactured in the same way as in Example 1 except that welding of an inner crucible member to rucible member was conducted at 1200° C. of remaining observation is shown in Table 1.

TABLE 1

| Example No. | Observations |
| --- | --- |
| 1 | Welding was carried out in a short time, but a few bubbles were generated in the interface of a dual crucible. |
| 2 | Welding was completed in a good order with a decreased number of bubbles in the interface of a dual crucible. |
| 3 | Welding was completed in a good order with no bubble in the interface of a dual crucible and the production yield was good. |
| 4 | Poor welding resulted. |

EFFECTS OF INVENTION

In a method of manufacture according to the present invention, a quartz crucible for a double-crucible growing technique can be manufactured with excellent characteristics of junction, a low production cost and a high production yield. Silicon single crystal rods each having a larger diameter are continuously pulled in a quartz crucible for a double-crucible growing technique according to the present invention in a satisfactory manner.

What is claimed is:

1. A method of manufacturing a crucible for a double-crucible growing technique comprising the steps of:

feeding quartz powder into a rotating mold generating centrifugal force;

forming a crucible shaped quartz powder layer body having an inner surface by said centrifugal force in the mold;

melting the inner surface of the body by heating with an arc discharge to form an outer crucible member; and welding an inner crucible member to the outer crucible member while a temperature of the inner surface portion remains at 1400° C. or higher by heat remaining after melting.

2. A method of manufacturing a crucible for a double-crucible growing technique according to claim 1, wherein the inner crucible member is preheated at a temperature of at least 1400° C. prior to welding the inner crucible member to the outer crucible member.

3. A method of manufacturing a crucible for a double-crucible growing technique according to claim 1, wherein the surface of the inner crucible member is formed as a hollow cylinder having a lower end provided with a beveled edge which is inwardly inclined at 30 degrees to 60 degrees.

4. A method of manufacturing a crucible for a double-crucible growing technique according to claim 1, wherein the inner crucible member has a lower end having a beveled edge which is aligned with a plane perpendicular to the inner crucible member axis with a gap of 1 mm or less.

5. A method of manufacturing a crucible for a double-crucible growing technique according to claim 1, wherein the inner crucible member has an outside diameter which is 70% to 90% of an inside diameter of the outer crucible member.

6. A method of manufacturing a crucible for a double-crucible growing technique according to claim 1, wherein at least one capillary opening for melt pass is formed in a lower part of the inner crucible member.

* * * * *

UNITED STATES PATENT AND TRADEMARK OFFICE
CERTIFICATE OF CORRECTION

PATENT NO. : 5,917,103
DATED : June 29, 1999
INVENTOR(S) : Watanabe et al.

It is certified that error appears in the above-identified patent and that said Letters Patent is hereby corrected as shown below:

Column 5, lines 16-17, delete "portion".

Signed and Sealed this

Thirtieth Day of November, 1999

Attest:

Attesting Officer

Q. TODD DICKINSON

Acting Commissioner of Patents and Trademarks